(12) United States Patent
Wei et al.

(10) Patent No.: US 11,825,661 B2
(45) Date of Patent: Nov. 21, 2023

(54) MOBILITY ENHANCEMENT BY SOURCE AND DRAIN STRESS LAYER OF IMPLANTATION IN THIN FILM TRANSISTORS

(71) Applicant: Taiwan Semiconductor Manufacturing Company Limited, Hsinchu (TW)

(72) Inventors: Hui-Hsien Wei, Taoyuan (TW); Yen-Chung Ho, Hsinchu (TW); Chia-Jung Yu, Hsinchu (TW); Yong-Jie Wu, Hsinchu (TW); Pin-Cheng Hsu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 42 days.

(21) Appl. No.: 17/368,869

(22) Filed: Jul. 7, 2021

(65) Prior Publication Data
US 2022/0093616 A1    Mar. 24, 2022

Related U.S. Application Data
(60) Provisional application No. 63/082,110, filed on Sep. 23, 2020.

(51) Int. Cl.
*H01L 29/78* (2006.01)
*H10B 53/30* (2023.01)
(Continued)

(52) U.S. Cl.
CPC ....... *H10B 53/30* (2023.02); *H01L 29/41733* (2013.01); *H01L 29/7845* (2013.01); *H01L 29/78618* (2013.01)

(58) Field of Classification Search
CPC .......... H01L 29/41733; H01L 29/7845; H01L 29/78618
See application file for complete search history.

(56) References Cited

U.S. PATENT DOCUMENTS

| | | | | |
|---|---|---|---|---|
| 6,593,217 B1 * | 7/2003 | Fujisawa | ........... | H01L 21/28518 |
| | | | | 257/E21.252 |
| 8,299,455 B2 * | 10/2012 | Doris | .................... | H01L 23/485 |
| | | | | 257/377 |

(Continued)

FOREIGN PATENT DOCUMENTS

| KR | 20110040470 A | 4/2011 |
|---|---|---|
| KR | 20170080996 A | 7/2017 |

(Continued)

OTHER PUBLICATIONS

Taiwan Patent and Trademark Office, Application No. 110131560, Office Action dated May 29, 2023,, 6 pages.

(Continued)

*Primary Examiner* — Eugene Lee
(74) *Attorney, Agent, or Firm* — The Marbury Law Group, PLLC

(57) ABSTRACT

A planar insulating spacer layer can be formed over a substrate, and a combination of a semiconducting material layer, a thin film transistor (TFT) gate dielectric layer, and a gate electrode can be formed over the planar insulating spacer layer. A dielectric matrix layer is formed thereabove. A source-side via cavity and a drain-side via cavity can be formed through the dielectric matrix layer over end portions of the semiconducting material layer. Mechanical stress can be generated between the end portions of the semiconducting material layer by changing a lattice constant of end portions of the semiconducting material layer. The mechani- (Continued)

cal stress can enhance the mobility of charge carriers in a channel portion of the semiconducting material layer.

20 Claims, 11 Drawing Sheets

(51) Int. Cl.
*H01L 29/786* (2006.01)
*H01L 29/417* (2006.01)

(56) References Cited

U.S. PATENT DOCUMENTS

| | | | | |
|---|---|---|---|---|
| 8,803,208 B2* | 8/2014 | Zhu | ............ | H01L 23/485 |
| | | | | 257/E21.507 |
| 9,214,396 B1* | 12/2015 | Flachowsky | ........ | H01L 29/7848 |
| 9,768,300 B2* | 9/2017 | Shin | ............ | H01L 29/165 |
| 9,876,094 B2* | 1/2018 | Bae | ............ | H01L 21/76843 |
| 10,529,859 B2* | 1/2020 | Ryu | ............ | H01L 29/41766 |
| 11,569,350 B2* | 1/2023 | Lee | ............ | H01L 29/7851 |
| 2002/0105039 A1* | 8/2002 | Hanafi | ............ | H01L 29/78648 |
| | | | | 257/E21.415 |
| 2006/0131662 A1* | 6/2006 | Yamada | ............ | H01L 21/823871 |
| | | | | 257/E21.585 |
| 2006/0220113 A1* | 10/2006 | Tamura | ............ | H01L 23/485 |
| | | | | 257/E21.538 |
| 2006/0281316 A1* | 12/2006 | Komuro | ............ | H01L 21/32136 |
| | | | | 257/E21.309 |
| 2008/0023772 A1* | 1/2008 | Kawakita | ............ | H01L 27/10894 |
| | | | | 257/E29.345 |
| 2012/0074502 A1* | 3/2012 | Ellis-Monaghan | ... | H01L 23/485 |
| | | | | 257/E21.598 |
| 2012/0161144 A1* | 6/2012 | Joo | ............ | H01L 29/42384 |
| | | | | 438/156 |
| 2012/0292670 A1* | 11/2012 | Cai | ............ | H01L 29/78 |
| | | | | 257/288 |
| 2014/0154856 A1* | 6/2014 | Alptekin | ............ | H01L 29/66575 |
| | | | | 438/299 |
| 2015/0311287 A1* | 10/2015 | Nemouchi | ............ | H01L 21/823807 |
| | | | | 438/653 |
| 2016/0204203 A1* | 7/2016 | Tateshita | ............ | H01L 21/823807 |
| | | | | 257/192 |
| 2016/0240687 A1* | 8/2016 | Hu | ............ | H01L 29/66969 |
| 2019/0363193 A1* | 11/2019 | Dewey | ............ | H01L 29/78693 |
| 2020/0227519 A1* | 7/2020 | Song | ............ | H01L 29/66969 |

FOREIGN PATENT DOCUMENTS

| | | |
|---|---|---|
| KR | 20190045659 A | 5/2019 |
| KR | 20190053338 A | 5/2019 |

OTHER PUBLICATIONS

Korean Patent and Trademark Office, Application No. 2021 0116328, Office Action, dated Nov. 16, 2022, 6 pages.

* cited by examiner

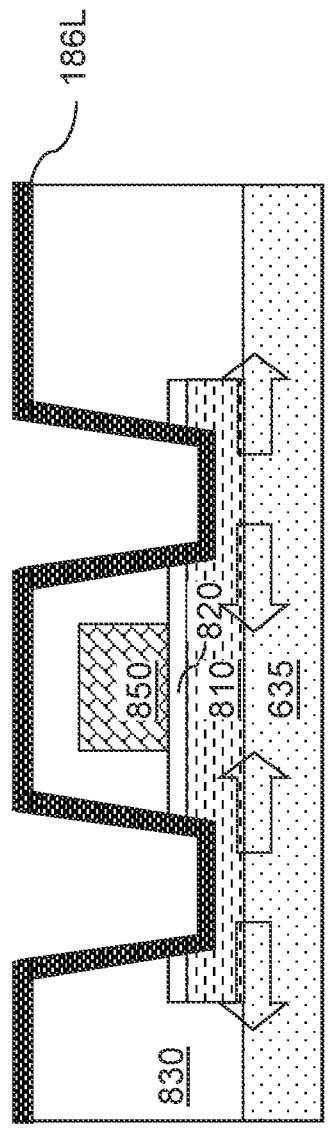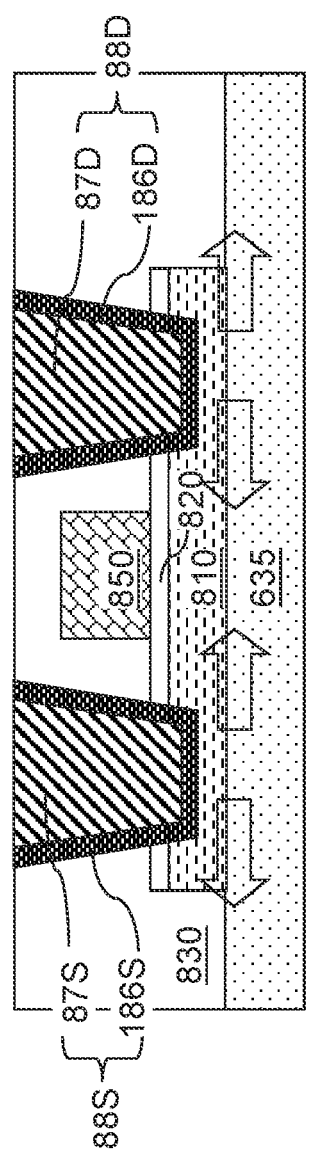

MOBILITY ENHANCEMENT BY SOURCE AND DRAIN STRESS LAYER OF IMPLANTATION IN THIN FILM TRANSISTORS

RELATED APPLICATIONS

This application claims the benefit of priority from U.S. Provisional Application No. 63/082,110, entitled "Mobility improve BY TFT/Selector Source and drain stress layer or Implantation," filed on Sep. 23, 2020, the entire contents of which are incorporated herein by reference for all purposes.

BACKGROUND

Thin film transistors (TFT) made of oxide semiconductors are an attractive option for BEOL integration since TFTs may be processed at low temperatures and thus, will not damage previously fabricated devices. For example, the fabrication conditions and techniques may not damage previously fabricated FEOL devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B are sequential vertical cross-sectional views of a second exemplary thin film transistor structure according to an embodiment of the present disclosure.

DETAILED DESCRIPTION

Figure 1:
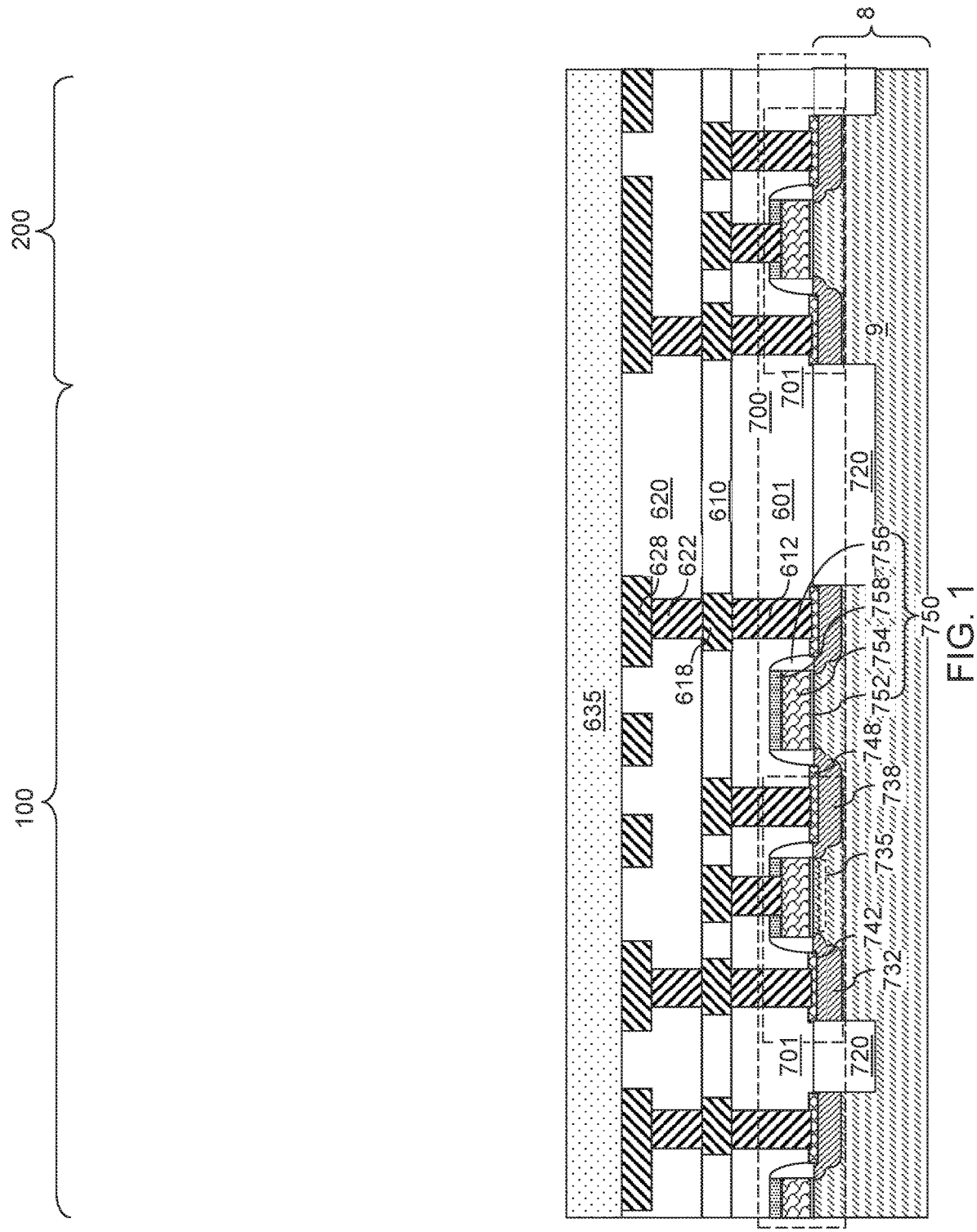
FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including thin film transistors. Specifically, the structures and methods of the present disclosure may be used to form a semiconductor structure including thin film transistors in which a channel portion of each thin film transistor may be mechanically stressed with compressive stress or tensile stress to provide enhanced on-current through the semiconductor channel. The mechanical stress may be induced by a metallic liner that induces compressive stress or tensile stress in end portions of a semiconducting material layer. Alternatively or additionally, the mechanical stress may be induced by implanting dopants into end portions of the semiconducting metal oxide material layer.

Referring to FIG. 1, an exemplary structure according to an embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of ferroelectric memory cells may be subsequently formed. The exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source region 732 or a respective drain region 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and/or WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process. While the present disclosure is described using an embodiment in which an array of memory cells is formed over the second line-and-via-level dielectric material layer 620, embodiments are expressly contemplated herein in which the array of memory cells may be formed at a different metal interconnect level.

An array of thin film transistors and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as a planar insulating spacer layer 635. The planar insulating spacer layer 635 includes a dielectric material such as undoped silicate glass, a doped silicate glass, organosilicate glass, or a porous dielectric material, and may be deposited by chemical vapor deposition. The thickness of the planar insulating spacer layer 635 may be in a range from 30 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) can be formed over semiconductor devices. The planar insulating spacer layer 635 can be formed over the interconnect-level dielectric layers.

FIG. 2A-2D are sequential vertical cross-sectional views of a first exemplary thin film transistor structure that can be formed on the planar insulating spacer layer 635 according to an embodiment of the present disclosure.

Figure 2A:
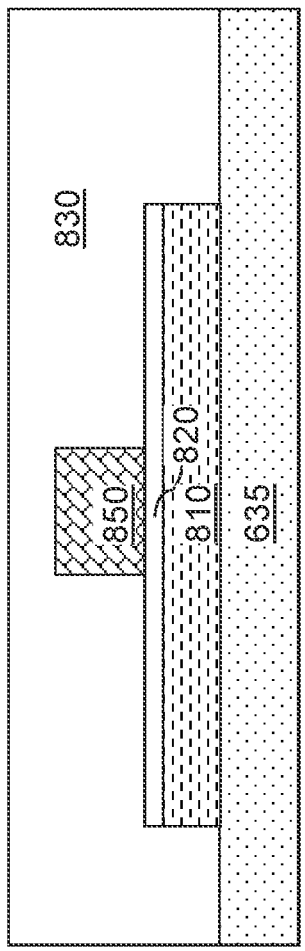
FIG. 2A-2D are sequential vertical cross-sectional views of a first exemplary thin film transistor structure according to an embodiment of the present disclosure.

Referring to FIG. 2A, a semiconducting material 810 may be deposited over the planar insulating spacer layer 635. The semiconducting material includes a material providing electrical conductivity in a range from 1.0 S/m to $1.0 \times 10^5$ S/m upon suitable doping with electrical dopants (which may be p-type dopants or n-type dopants). In an intrinsic state or under a condition of a low-level electrical doping, a semiconducting material may be semiconducting or insulating, and may have electrical conductivity generally in a range from $1.0 \times 10^{-10}$ S/m to $1.0 \times 10$ S/m. Exemplary semiconducting materials that may be used for the semiconducting material include, but are not limited to, amorphous silicon, polysilicon, an amorphous silicon-germanium alloy, a polycrystalline silicon-germanium alloy, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting material may include indium gallium zinc oxide.

The semiconducting material 810 may include a polycrystalline semiconducting material, or an amorphous semiconducting material that may be subsequently annealed into a polycrystalline semiconducting material having a greater average grain size. The semiconducting material 810 may be deposited by physical vapor deposition. The thickness of the semiconducting material may be in a range from 1 nm to 100 nm, such as from 2 nm to 50 nm and/or from 4 nm to 15 nm, although lesser and greater thicknesses may also be used.

A gate dielectric material 820 may be formed over the semiconducting material 810 by conformal deposition of a gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the gate dielectric material may be in a range from 1 nm to 12 nm, such as from 2 nm to 6 nm, although lesser and greater thicknesses may also be used.

A photoresist layer (not shown) may be applied over the gate dielectric material 820, and may be lithographically patterned into at least one discrete photoresist material portion. In one embodiment, the photoresist layer may be patterned into a two-dimensional array of photoresist material portions such that each patterned photoresist material portion covers an area of a semiconducting material layer 810 to be subsequently patterned. Unmasked portions of the gate dielectric material and the semiconducting material may be etched, for example, by an anisotropic etch process using the photoresist material portions of the photoresist layer as an etch mask.

Remaining portions of the gate dielectric material constitutes thin film transistor (TFT) gate dielectric layers 820. Remaining portions of the semiconducting material constitutes semiconducting material layers 810. In one embodiment, a two-dimensional array of stacks of a TFT gate dielectric layer 820 and a semiconducting material layer 810 may be formed. The photoresist layer may be subsequently removed, for example, by ashing.

Each semiconducting material layer 810 may have a rectangular horizontal cross-sectional shape or a rounded rectangular horizontal cross-sectional shape. Each semiconducting material layers 810 may have a pair of lengthwise edges that laterally extend along a first horizontal direction. Each semiconducting material layers 810 may also have a pair of widthwise edges that laterally extend along a second horizontal direction that is perpendicular to the first horizontal direction. Each semiconducting material layer 810 may be formed on a top surface of the planar insulating spacer layer 635, and each TFT gate dielectric layer 820 may be formed on a top surface of the semiconductor material layer 810.

At least one conductive material may be deposited over the TFT gate dielectric layers 820, and may be patterned into discrete conductive material portions to form at least one gate electrode 850. The at least one gate electrode 850 may be part of an array of gate electrodes 850. The at least one conductive material may be patterned into the gate electrodes 850, for example, by application and patterning of a photoresist layer over the at least one metallic material, and by transfer of the pattern in the photoresist layer through the at least one metallic material using an etch process such as an anisotropic etch process. The photoresist layer may be subsequently removed, for example, by ashing. In one embodiment, a one-dimensional array or a two-dimensional array of gate electrodes 850 may be formed over a two-dimensional array of stacks of a semiconducting material layer 810 and a TFT gate dielectric layer 820.

The at least one conductive material of the gate electrodes 850 may include at least one conductive metallic nitride material (such as TiN, TaN, and/or WN), an elemental metal (such as W, Cu, Ru, Co, Mo, Ni, Al, etc.), and/or an intermetallic alloy of at least two elemental metals. Other suitable conductive materials are within the contemplated scope of disclosure. The at least one conductive material of the gate electrodes 850 may be deposited by physical vapor deposition, chemical vapor deposition, electroplating, or electroless plating. The thickness of the gate electrodes 850 may be in a range from 10 nm to 100 nm, although lesser and greater thicknesses may also be used.

Each contiguous combination of a semiconducting material layer 810, a TFT gate dielectric layer 820, and a gate electrode 850 constitutes a thin film transistor (TFT). A dielectric matrix layer 830 may be formed over each combination of a semiconducting material layer 810, a TFT gate dielectric layer 820, and a gate electrode 850. The dielectric matrix layer 830 may be planarized to provide a flat top surface. The dielectric matrix layer 830 may include a self-planarizing dielectric material such as a flowable oxide (FOX) or a planarizable dielectric material such as undoped silicate glass or a doped silicate glass. The thickness of the dielectric matrix layer 830, as measured from an interface with the planar insulating spacer layer 635, may be in a range from 100 nm to 1,000 nm, such as from 200 nm to 500 nm, although lesser and greater thicknesses may also be used.

Figure 2B:
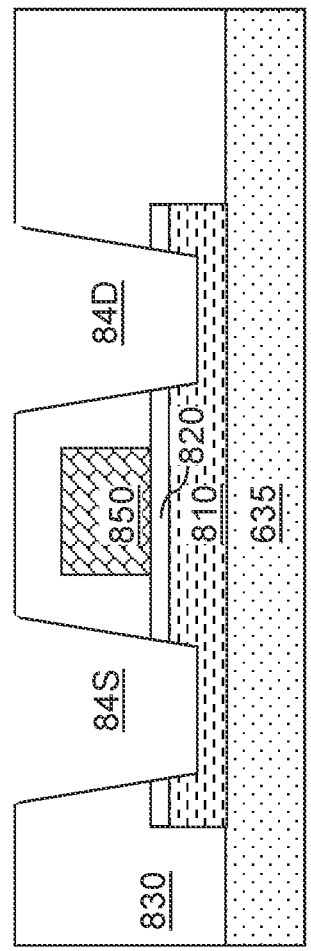

Referring to FIG. 2B, a photoresist layer (not shown) may be applied over the dielectric matrix layer 830. The photoresist layer may be lithographically patterned to form openings over end portions of each semiconducting material layer 810 and optionally over areas of the second metal line structures 628 (shown in FIG. 1). An anisotropic etch process may be performed to transfer the pattern of the openings in the photoresist layer through the dielectric matrix layer 830 to form via cavities (84S, 84D) extending to the semiconducting material layer 810. The via cavities can include source-side via cavities 84S, drain-side via cavities 84D, and gate-side via cavities (not shown). Optionally, additional via cavities extending down to a respective one of the second metal line structures 628 may be formed simultaneously with formation of the source-side via cavities 84S, the drain-side via cavities 84D, and the gate-side via cavities. Generally, the additional via cavities extending down to a respective one of the second metal line structures 628 may be formed concurrently with formation of the source-side via cavities 84S, the drain-side via cavities 84D, and the gate-side via cavities, or may be formed using an additional lithographic patterning process and an additional anisotropic etch process.

In one embodiment, each source-side via cavity 84S and each drain-side via cavity 84D may vertically extend through the dielectric matrix layer 830, through the TFT gate dielectric layer 820, and into upper regions of the end portions of each semiconducting material layer 810. The recess depth of the source-side via cavities 84S and the drain-side via cavities 84D into the semiconducting material layer 810 may be in a range from 1 nm to 25 nm, such as from 2 nm to 15 nm, although lesser and greater recess depths may also be used. In one embodiment, each of the source-side via cavities 84S and the drain-side via cavities 84D may be formed with a taper angle, which may be advantageously used to increase the net mechanical stress in a final device structure. In one embodiment, the taper angle, as measured from a vertical direction, may be in a range from 0.5 degree to 20 degrees, such as from 2 degrees to 10 degrees, although lesser and greater taper angles may also be used.

Figure 2C:
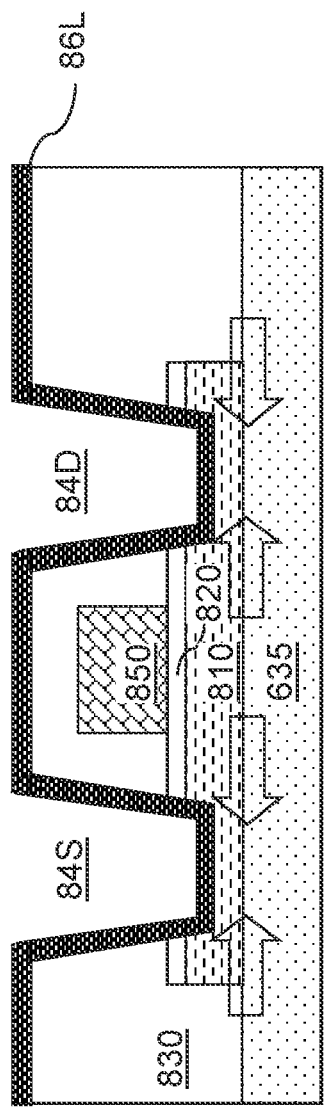

Referring to FIG. 2C, a metallic material may be deposited in the source-side via cavities 84S and the drain-side via cavities 84D and over the dielectric matrix layer 830 to form a metallic liner layer 86L. The metallic material of the metallic liner layer 86L may be any metallic material that induces lateral mechanical stress in underlying portions of the semiconducting material layers 810. In one embodiment, the stress-generating metallic material may include one or more of Co, Ru, Mo, Ti, Ta, TiN, TaN, WN, alloys thereof, compounds thereof, and layer stacks thereof. Other stress generating metallic materials are within the contemplated scope of disclosure. The thickness of the metallic liner layer 86L may be in a range from 1 nm to 20 nm, such as from 2 nm to 10 nm, although lesser and greater thicknesses may also be used.

Generally, the metallic liner layer 86L may be deposited directly on physically exposed surfaces of end portions of each semiconducting material layer 810, and includes a metallic material that generates tensile stress or compressive stress. According to an aspect of the present disclosure, the metallic liner layer 86L generates tensile stress or compressive stress within the end portions of each semiconducting material layer 810. The metallic liner layer 86L changes the lattice constant of the end portions of each semiconducting material layer 810.

In one embodiment, the metallic liner layer 86L may be deposited by atomic layer deposition (ALD). A metallic precursor layer may be adsorbed to surfaces of the dielectric matrix layer 830 and the semiconducting material layers 810, and may be thermally decompose to remove volatile functional groups. A remaining metallic element may be deposited to form the metallic liner layer 86L. In this embodiment, the metallic liner layer 86L may induce compressive stress within the end portions of the semiconducting material layer 810. The compressive stress within the end portions of the semiconducting material layer 810 induces tensile stress between the end portions of the semiconducting material layer 810, i.e., within each channel portion of the semiconducting material layer 810.

Figure 2D:
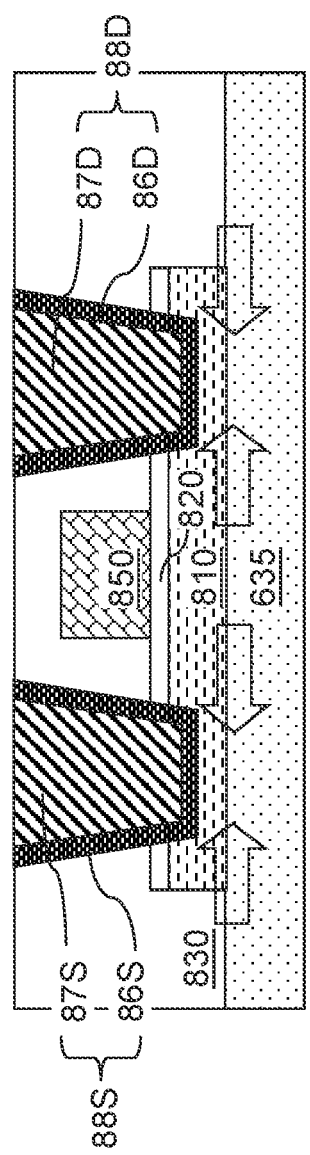

Referring to FIG. 2D, a metallic fill material may be deposited in remaining volumes of the source-side via cavities 84S and the drain-side via cavities 84D. The metallic fill material may be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other suitable metallic fill materials may be within the contemplated scope of disclosure.

Excess portions of the metallic fill material and the metallic liner layer 86L may be removed from above the horizontal plane including the top surface of the dielectric matrix layer 830 by a planarization process, which may include a chemical mechanical planarization (CMP) process. Each remaining portion of the metallic fill material that remains in a source-side via cavity 84S constitutes a source-side metallic fill material portion 87S. Each remaining portion of the metallic fill material that remains in a drain-side via cavity 84D constitutes a drain-side metallic fill material portion 87D. Each remaining portion of the metallic liner layer 86L in a source-side via cavity 84S constitutes a source-side metallic liner 86S. Each remaining portion of the metallic liner layer 86L in a drain-side via cavity 84D constitutes a drain-side metallic liner 86D.

Each contiguous combination of a remaining portion of the metallic liner layer 86L and a remaining portion of the metallic fill material comprises a source structure 88S or a drain structure 88D. Specifically, each contiguous combination of a source-side metallic liner 86S and a source-side metallic fill material portion 87S constitutes a source structure 88S. Each contiguous combination of a drain-side metallic liner 86D and a drain-side metallic fill material portion 87D constitutes a drain structure 88D. The source structures 88S and the drain structures 88D generate mechanical stress between end portions of each semiconducting material layer 810 by changing the lattice constant of end portions of the semiconducting material layer 810 that underlie the source structures 88S and the drain structures 88D.

FIGS. 3A and 3B are sequential vertical cross-sectional views of a second exemplary thin film transistor structure according to an embodiment of the present disclosure.

Referring to FIG. 3A, an alternative structure for forming a thin film transistor is illustrated, which can be derived from the exemplary structure at the processing step of FIG. 2B by depositing a metallic material in the source-side via cavities 84S and the drain-side via cavities 84D and over the dielectric matrix layer 830 to form a metallic liner layer 186L. The metallic material of the metallic liner layer 186L can be any metallic material that induces tensile lateral mechanical stress in underlying portions of the semiconducting material layers 810. In one embodiment, the metallic liner layer 186L can be deposited by physical vapor deposition (PVD), which can deposit tensile-stress-generating metallic materials. In one embodiment, the stress-generating metallic material may include one or more of Co, Ru, Mo, Ti, Ta, TiN, TaN, WN, alloys thereof, compounds thereof, and layer stacks thereof. Other stress generating metallic materials are within the contemplated scope of disclosure. The thickness of the metallic liner layer 186L may be in a range from 1 nm to 20 nm, such as from 2 nm to 10 nm, although lesser and greater thicknesses may also be used. The metallic liner layer 186L changes (for example, increases) the lattice constant of the end portions of each semiconducting material layer 810. The metallic liner layer 186L can induce tensile stress within the end portions of the semiconducting material layer 810. The tensile stress within the end portions of the semiconducting material layer 810 induces compressive stress between the end portions of the semiconducting material layer 810, i.e., within each channel portion of the semiconducting material layer 810.

Referring to FIG. 3B, a metallic fill material may be deposited in remaining volumes of the source-side via cavities 84S and the drain-side via cavities 84D. The metallic fill material can be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other metallic fill materials are within the contemplated scope of disclosure.

Excess portions of the metallic fill material and the metallic liner layer 186L may be removed from above the horizontal plane including the top surface of the dielectric matrix layer 830 by a planarization process, which may include a chemical mechanical planarization (CMP) process. Each remaining portion of the metallic fill material that remains in a source-side via cavity 84S constitutes a source-side metallic fill material portion 87S. Each remaining portion of the metallic fill material that remains in a drain-side via cavity 84D constitutes a drain-side metallic fill material portion 87D. Each remaining portion of the metallic liner layer 186L in a source-side via cavity 84S constitutes a source-side metallic liner 186S. Each remaining portion of the metallic liner layer 186L in a drain-side via cavity 84D constitutes a drain-side metallic liner 186D.

Each contiguous combination of a remaining portion of the metallic liner layer 186L and a remaining portion of the metallic fill material comprises a source structure 88S or a drain structure 88D. Specifically, each contiguous combination of a source-side metallic liner 186S and a source-side metallic fill material portion 87S constitutes a source structure 88S. Each contiguous combination of a drain-side metallic liner 186D and a drain-side metallic fill material portion 87D constitutes a drain structure 88D. The source structures 88S and the drain structures 88D generate mechanical stress between end portions of each semiconducting material layer 810 by changing the lattice constant of end portions of the semiconducting material layer 810 that underlie the source structures 88S and the drain structures 88D.

Figure 4A:
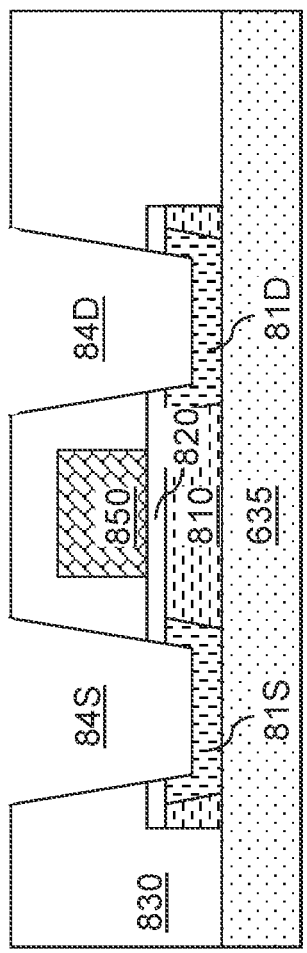
FIGS. 4A and 4B are sequential vertical cross-sectional views of a third exemplary thin film transistor structure according to an embodiment of the present disclosure.
Figure 4B:
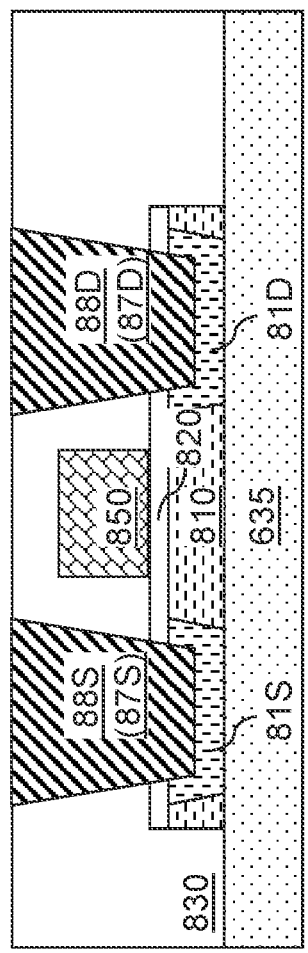

FIGS. 4A and 4B are sequential vertical cross-sectional views of a third exemplary thin film transistor structure according to an embodiment of the present disclosure.

Referring to FIG. 4A, a structure for forming the third exemplary thin film transistor may be derived from the structure of FIG. 2B by implanting dopants into portions of the semiconducting material layers 810 that underlie the source-side via cavities 84S and the drain-side via cavities 84D. The dopants may comprise p-type dopant elements such as B, Ga, or In; n-type dopant elements such as P, As, or Sb; or a metallic element (such as a transition metal). The species and the dose of the implanted dopants may be selected such that incorporation of the dopants into substitutional lattice sites of the semiconducting material layers 810 in a subsequent anneal process changes the lattice constant of the semiconducting material layers 810 by at least 0.01%. A source-side doped region 81S may be formed underneath each source-side via cavity 84S, and drain-side doped region 81D may be formed underneath each drain-side via cavity 84D. In one embodiment, the atomic concentration of the implanted dopants in the source-side doped regions 81S and the drain-side doped regions 81D may be in a range from $1.0 \times 10^{19}/cm^3$ to $1.0 \times 10^{21}/cm^3$, although lesser and greater dopant concentrations may also be used.

In one embodiment, the semiconducting material layer 810 may include a dielectric metal oxide material, and the implanted dopants may comprise a metallic element such as a transition metal element. In this embodiment, oxygen atoms can be implanted concurrently with, or after, implantation of the metallic element to reduce or eliminate stoichiometric imbalance (i.e., oxygen deficiency) in the implanted dielectric metal oxide material. The metallic element that is implanted to form the source-side doped regions 81S and the drain-side doped regions 81D may be selected such that the doped dielectric metal oxide material in the source-side doped regions 81S and the drain-side doped regions 81D may have a different lattice constant than the unimplanted portions (i.e., the channel portions) of the semiconducting material layer 810 located between a neighboring pair of a source-side doped regions 81S and a drain-side doped regions 81D.

In one embodiment, the doped semiconducting material in the source-side doped regions 81S and the drain-side doped regions 81D may have a smaller lattice constant than the semiconductor material of the channel portions (i.e., the unimplanted portions) of the semiconducting material layer 810. In this embodiment, the channel portions of the semiconducting material layer 810 may be under tensile stress. Alternatively, the doped semiconducting material in the source-side doped regions 81S and the drain-side doped regions 81D may have a greater lattice constant than the semiconductor material of the channel portions (i.e., the unimplanted portions) of the semiconducting material layer 810. In this embodiment, the channel portions of the semiconducting material layer 810 may be under compressive stress.

Referring to FIG. 4B, a metallic fill material may be deposited in the source-side via cavities 84S and the drain-side via cavities 84D. The metallic fill material can be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other suitable metallic fill materials are within the contemplated scope of disclosure.

Excess portions of the metallic fill material may be removed from above the horizontal plane including the top surface of the dielectric matrix layer 830 by a planarization process, which may include a chemical mechanical planarization (CMP) process. Each remaining portion of the metallic fill material that remains in a source-side via cavity 84S comprises a source-side metallic fill material portion 87S, which constitutes a source structure 88S. Each remaining portion of the metallic fill material that remains in a drain-side via cavity 84D comprises a drain-side metallic fill material portion 87D, which constitutes a drain structure 88D.

The source-side doped regions 81S and a drain-side doped regions 81D may have a modified lattice constant, and may generate mechanical stress between the end portions of the semiconducting material layer 810 (i.e, between the source-side doped regions 81S and the drain-side doped regions 81D) that underlie the source structure 88S and the drain structure 88D of each thin film transistor.

Referring to FIGS. 2A-4B, a thin film transistor may have a configuration in which the semiconducting material layer 810 contacts a top surface of the planar insulating spacer layer 635, and the TFT gate dielectric layer 820 contacts a top surface of the semiconductor material layer 810. The gate electrode 850 may contact a top surface of the TFT gate dielectric layer 820.

FIG. 5A-5D are sequential vertical cross-sectional views of a fourth exemplary thin film transistor structure according to an embodiment of the present disclosure.

Figure 5A:
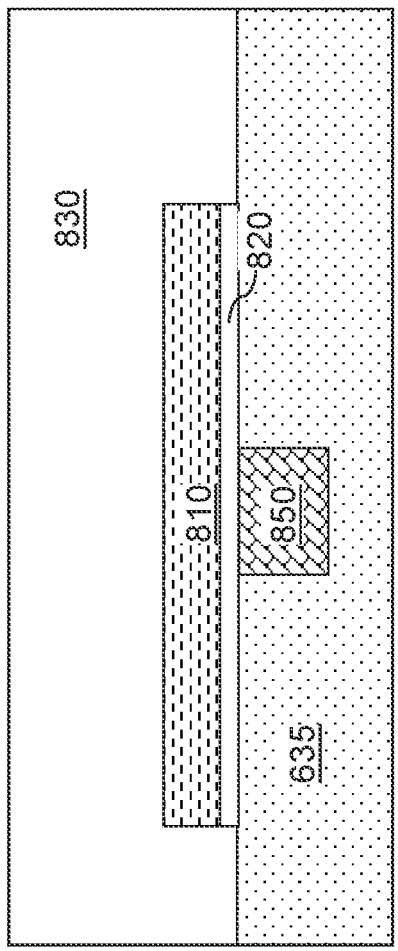
FIG. 5A-5D are sequential vertical cross-sectional views of a fourth exemplary thin film transistor structure according to an embodiment of the present disclosure.

Referring to FIG. 5A, a region of the exemplary structure of FIG. 1 is illustrated after formation of a bottom gate electrode 850, a thin film transistor (TFT) gate dielectric layer 820, and a semiconducting material layer 810. In this embodiment, recesses can be formed in the top surface of the planar insulating spacer layer 635. At least one conductive material can be deposited in the recesses in the planar insulating spacer layer 635. Excess portions of the at least one conductive material can be removed from above the horizontal plane including the top surface of the planar insulating spacer layer 635. Each remaining portion of the at least one conductive material constitutes a bottom gate electrode 850 (sometimes referred to as a back gated electrode 850).

A gate dielectric material may be formed over the bottom gate electrodes 850 by conformal deposition of a gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the gate dielectric material may be in a range from 1 nm to 12 nm, such as from 2 nm to 6 nm, although lesser and greater thicknesses may also be used.

A semiconducting material may be deposited over the gate dielectric material. The semiconducting material may have the same material composition and the same thickness range as the semiconducting material layer 810 described above.

A photoresist layer (not shown) may be applied over the semiconducting material, and may be lithographically patterned into at least one discrete photoresist material portion. In one embodiment, the photoresist layer may be patterned into a two-dimensional array of photoresist material portions such that each patterned photoresist material portion covers an area of a semiconducting material layer 810 to be subsequently patterned. Unmasked portions of the gate dielectric material and the semiconducting material may be etched, for example, by an anisotropic etch process using the photoresist material portions of the photoresist layer as an etch mask.

Remaining portions of the gate dielectric material constitutes thin film transistor (TFT) gate dielectric layers 820. Remaining portions of the semiconducting material constitutes semiconducting material layers 810. In one embodiment, a two-dimensional array of stacks of a TFT gate dielectric layer 820 and a semiconducting material layer 810 may be formed. The photoresist layer may be subsequently removed, for example, by ashing.

Each semiconducting material layer 810 may have a rectangular horizontal cross-sectional shape or a rounded rectangular horizontal cross-sectional shape. Each semiconducting material layers 810 may have a pair of lengthwise edges that laterally extend along a first horizontal direction. Each semiconducting material layers 810 may also have a pair of widthwise edges that laterally extend along a second horizontal direction that is perpendicular to the first horizontal direction. Each semiconducting material layer 810 can be formed on a top surface of the planar insulating spacer layer 635, and each TFT gate dielectric layer 820 can be formed on a top surface of the semiconductor material layer 810.

Each contiguous combination of a semiconducting material layer 810, a TFT gate dielectric layer 820, and a gate electrode 850 constitutes a thin film transistor (TFT). A dielectric matrix layer 830 may be formed over each combination of a semiconducting material layer 810, a TFT gate dielectric layer 820, and a gate electrode 850. The dielectric matrix layer 830 may be planarized to provide a flat top surface. The dielectric matrix layer 830 may include a self-planarizing dielectric material such as a flowable oxide (FOX) or a planarizable dielectric material such as undoped silicate glass or a doped silicate glass. The thickness of the dielectric matrix layer 830, as measured from an interface with the planar insulating spacer layer 635, may be in a range from 100 nm to 1,000 nm, such as from 200 nm to 500 nm, although lesser and greater thicknesses may also be used.

Figure 5B:
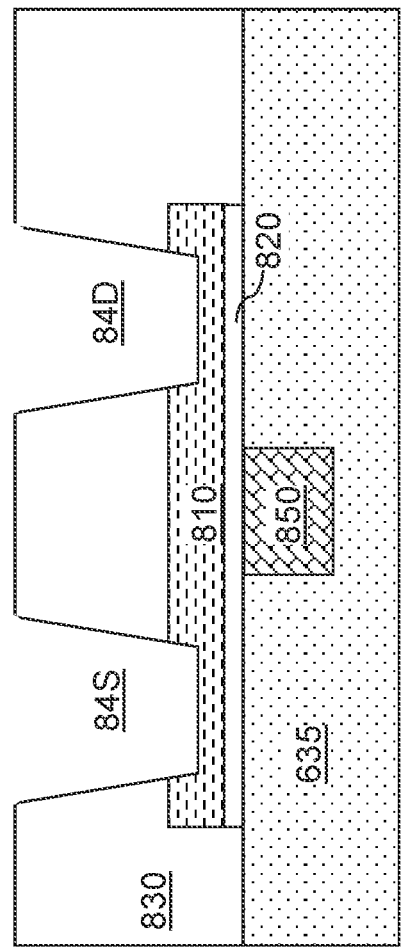

Referring to FIG. 5B, the processing steps of FIG. 2B may be performed to form via cavities. The via cavities can include source-side via cavities 84S, drain-side via cavities 84D, and gate-side via cavities (not shown). Optionally, additional via cavities extending down to a respective one of the second metal line structures 628 may be formed simultaneously with formation of the source-side via cavities 84S, the drain-side via cavities 84D, and the gate-side via cavities. Generally, the additional via cavities may be formed concurrently with formation of the source-side via cavities 84S, the drain-side via cavities 84D, and the gate-side via cavities, or may be formed using an additional lithographic patterning process and an additional anisotropic etch process.

In one embodiment, each source-side via cavity 84S and each drain-side via cavity 84D can vertically extend through the dielectric matrix layer 830, through the TFT gate dielectric layer 820, and into upper regions of the end portions of each semiconducting material layer 810. The recess depth of the source-side via cavities 84S and the drain-side via cavities into the semiconducting material layer 810 may be in a range from 1 nm to 25 nm, such as from 2 nm to 15 nm, although lesser and greater recess depths may also be used. In one embodiment, each of the source-side via cavities 84S and the drain-side via cavities 84D may be formed with a taper angle, which may be advantageously used to increase the net mechanical stress in a final device structure. In one embodiment, the taper angle, as measured from a vertical direction, may be in a range from 0.5 degree to 20 degrees, such as from 2 degrees to 10 degrees, although lesser and greater taper angles may also be used.

Figure 5C:
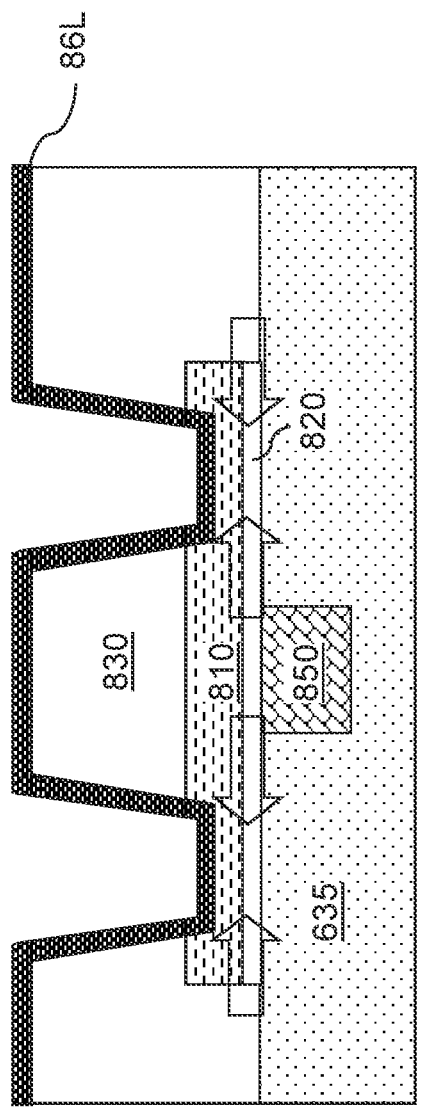

Referring to FIG. 5C, the processing steps of FIG. 2C may be performed to deposit a metallic material in the source-side via cavities 84S and the drain-side via cavities 84D and over the dielectric matrix layer 830. A metallic liner layer 86L is formed over the dielectric matrix layer 830. The material and the thickness range of the metallic liner layer 86L may be the same as in the structure illustrated in FIG. 2C.

In one embodiment, the metallic liner layer 86L may be deposited by atomic layer deposition. A metallic precursor layer can be adsorbed to surfaces of the dielectric matrix layer 830 and the semiconducting material layers 810, and may be thermally decompose to remove volatile functional groups. Remaining metallic element may be deposited to form the metallic liner layer 86L. In this embodiment, the metallic liner layer 86L may induce compressive stress within the end portions of the semiconducting material layer 810. The compressive stress within the end portions of the semiconducting material layer 810 induces tensile stress between the end portions of the semiconducting material layer 810, i.e., within each channel portion of the semiconducting material layer 810.

Figure 5D:
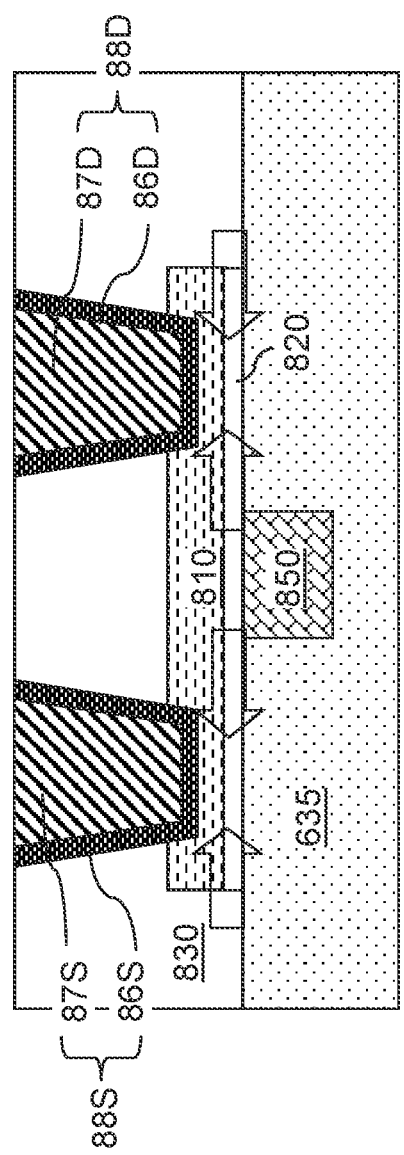

Referring to FIG. 5D, the processing steps of FIG. 2D may be performed to form source structures 88S or drain structures 88D in the source-side via cavities 84S and the drain-side via cavities 84D. Specifically, each contiguous combination of a source-side metallic liner 86S and a source-side metallic fill material portion 87S constitutes a source structure 88S. Each contiguous combination of a drain-side metallic liner 86D and a drain-side metallic fill material portion 87D constitutes a drain structure 88D. The source structures 88S and the drain structures 88D generate mechanical stress between end portions of each semiconducting material layer 810 by changing the lattice constant of end portions of the semiconducting material layer 810 that underlie the source structures 88S and the drain structures 88D.

Figure 6A:
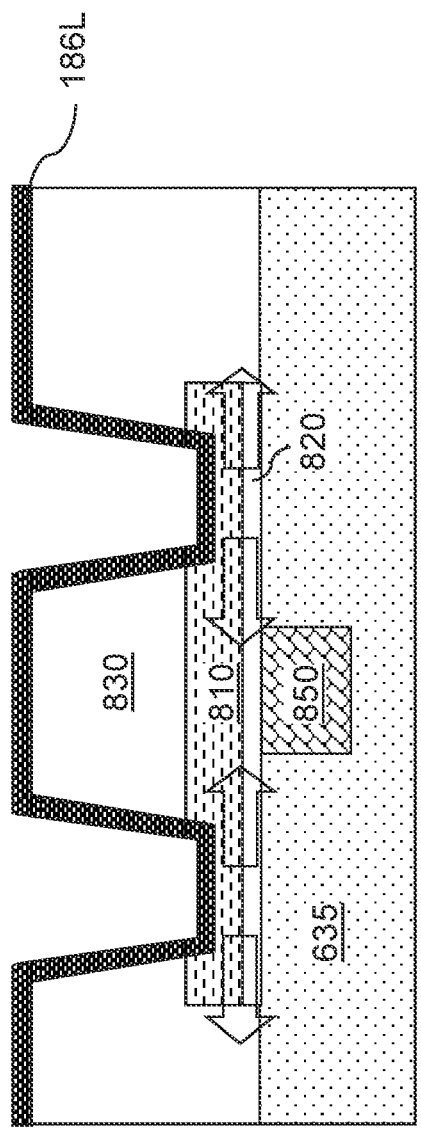
FIGS. 6A and 6B are sequential vertical cross-sectional views of a fifth exemplary thin film transistor structure according to an embodiment of the present disclosure.
Figure 6B:
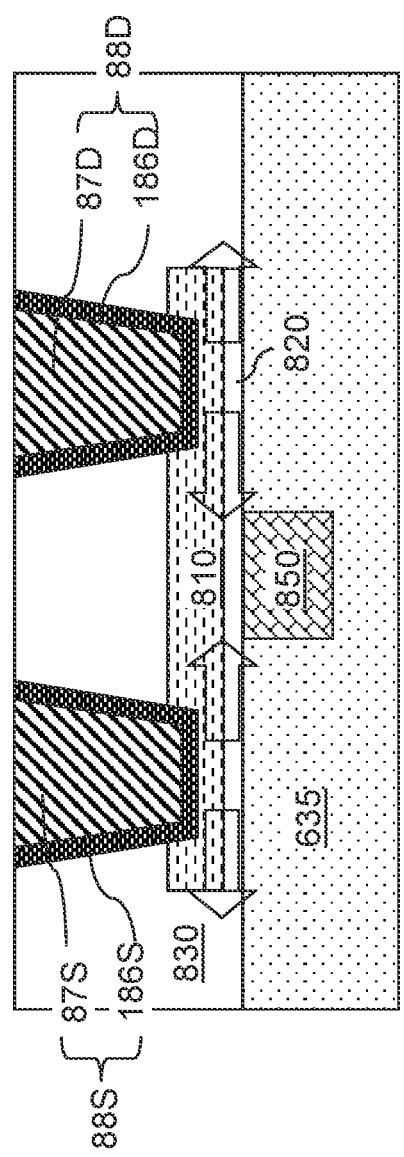

FIGS. 6A and 6B are sequential vertical cross-sectional views of a fifth exemplary thin film transistor structure according to an embodiment of the present disclosure.

Referring to FIG. 6A, an alternative structure for forming a thin film transistor is illustrated, which can be derived from the exemplary structure at the processing step of FIG. 5B by depositing a metallic material in the source-side via cavities 84S and the drain-side via cavities 84D and over the dielectric matrix layer 830 to form a metallic liner layer 186L. The metallic material of the metallic liner layer 186L can be any metallic material that induces tensile lateral mechanical stress in underlying portions of the semiconducting material layers 810. In one embodiment, the metallic liner layer 186L can be deposited by physical vapor deposition (PVD), which can deposit tensile-stress-generating metallic materials. In one embodiment, the stress-generating metallic material may include one or more of Co, Ru, Mo, Ti, Ta, TiN, TaN, WN, alloys thereof, compounds thereof, and layer stacks thereof. Other stress generating metallic materials are within the contemplated scope of disclosure. The thickness of the metallic liner layer 186L may be in a range from 1 nm to 20 nm, such as from 2 nm to 10 nm, although lesser and greater thicknesses may also be used. The metallic liner layer 86L changes (for example, increases) the lattice constant of the end portions of each semiconducting material layer 810. The metallic liner layer 186L can induce tensile stress within the end portions of the semiconducting material layer 810. The tensile stress within the end portions of the semiconducting material layer 810 induces compressive stress between the end portions of the semiconducting material layer 810, i.e., within each channel portion of the semiconducting material layer 810.

Referring to FIG. 6B, a metallic fill material can be deposited in remaining volumes of the source-side via cavities 84S and the drain-side via cavities 84D. The metallic fill material can be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other metallic fill materials are within the contemplated scope of disclosure.

Excess portions of the metallic fill material and the metallic liner layer 186L may be removed from above the horizontal plane including the top surface of the dielectric matrix layer 830 by a planarization process, which may include a chemical mechanical planarization (CMP) process. Each remaining portion of the metallic fill material that remains in a source-side via cavity 84S constitutes a source-side metallic fill material portion 87S. Each remaining portion of the metallic fill material that remains in a drain-side via cavity 84D constitutes a drain-side metallic fill material portion 87D. Each remaining portion of the metallic liner layer 186L in a source-side via cavity 84S constitutes a source-side metallic liner 186S. Each remaining portion of the metallic liner layer 186L in a drain-side via cavity 84D constitutes a drain-side metallic liner 186D.

Each contiguous combination of a remaining portion of the metallic liner layer 186L and a remaining portion of the metallic fill material comprises a source structure 88S or a drain structure 88D. Specifically, each contiguous combination of a source-side metallic liner 186S and a source-side metallic fill material portion 87S constitutes a source structure 88S. Each contiguous combination of a drain-side metallic liner 186D and a drain-side metallic fill material portion 87D constitutes a drain structure 88D. The source structures 88S and the drain structures 88D generate mechanical stress between end portions of each semiconducting material layer 810 by changing the lattice constant of end portions of the semiconducting material layer 810 that underlie the source structures 88S and the drain structures 88D.

Figure 7A:
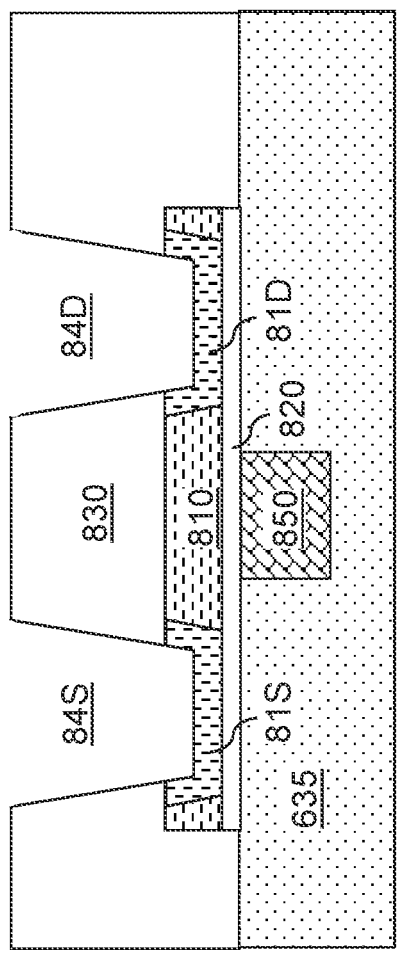
FIGS. 7A and 7B are sequential vertical cross-sectional views of a sixth exemplary thin film transistor structure according to an embodiment of the present disclosure.
Figure 7B:
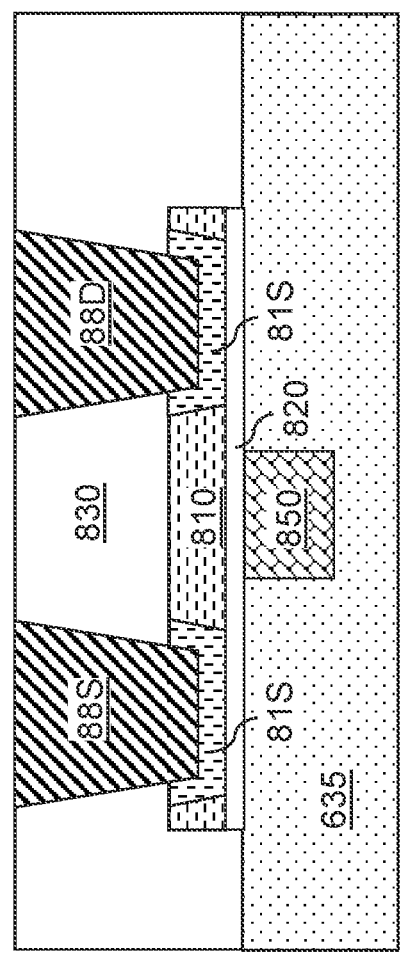

FIGS. 7A and 7B are sequential vertical cross-sectional views of a sixth exemplary thin film transistor structure according to an embodiment of the present disclosure.

Referring to FIG. 7A, a structure for forming the sixth exemplary thin film transistor may be derived from the structure of FIG. 5B by implanting dopants into portions of the semiconducting material layers 810 that underlie the source-side via cavities 84S and the drain-side via cavities 84D. The dopants may comprise p-type dopant elements such as B, Ga, or In; n-type dopant elements such as P, As, or Sb; or a metallic element (such as a transition metal). The species and the dose of the implanted dopants may be selected such that incorporation of the dopants into the semiconducting material layers 810 changes the lattice constant of the semiconducting material layers 810 by at least 0.01%. A source-side doped region 81S may be formed underneath each source-side via cavity 84S, and drain-side doped region 81D may be formed underneath each drain-side via cavity 84D. In one embodiment, the atomic concentration of the implanted dopants in the source-side doped regions 81S and the drain-side doped regions 81D may be in a range from $1.0 \times 10^{19}/cm^3$ to $1.0 \times 10^{21}/cm^3$, although lesser and greater dopant concentrations may also be used.

In one embodiment, the semiconducting material layer 810 may include a dielectric metal oxide material, and the implanted dopants may comprise a metallic element such as a transition metal element. In this embodiment, oxygen atoms can be implanted concurrently with, or after, implantation of the metallic element to reduce or eliminate stoichiometric imbalance (i.e., oxygen deficiency) in the implanted dielectric metal oxide material. The metallic element that may be implanted to form the source-side doped regions 81S and the drain-side doped regions 81D may be selected such that the doped dielectric metal oxide material in the source-side doped regions 81S and the drain-side doped regions 81D has a different lattice constant than the unimplanted portions (i.e., the channel portions) of the semiconducting material layer 810 located between a neighboring pair of a source-side doped regions 81S and a drain-side doped regions 81D.

In one embodiment, the doped semiconducting material in the source-side doped regions 81S and the drain-side doped regions 81D may have a smaller lattice constant than the semiconductor material of the channel portions (i.e., the unimplanted portions) of the semiconducting material layer 810. In this embodiment, the channel portions of the semiconducting material layer 810 may be under tensile stress. Alternatively, the doped semiconducting material in the source-side doped regions 81S and the drain-side doped regions 81D may have a greater lattice constant than the semiconductor material of the channel portions (i.e., the unimplanted portions) of the semiconducting material layer 810. In this embodiment, the channel portions of the semiconducting material layer 810 may be under compressive stress.

Referring to FIG. 7B, a metallic fill material may be deposited in the source-side via cavities 84S and the drain-side via cavities 84D. The metallic fill material can be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other metallic fill materials are within the contemplated scope of disclosure.

Excess portions of the metallic fill material may be removed from above the horizontal plane including the top surface of the dielectric matrix layer 830 by a planarization process, which may include a chemical mechanical planarization (CMP) process. Each remaining portion of the metallic fill material that remains in a source-side via cavity 84S comprises a source-side metallic fill material portion 87S, which constitutes a source structure 88S. Each remaining portion of the metallic fill material that remains in a drain-side via cavity 84D comprises a drain-side metallic fill material portion 87D, which constitutes a drain structure 88D.

The source-side doped regions 81S and a drain-side doped regions 81D may have a modified lattice constant, and may generate mechanical stress between the end portions of the semiconducting material layer 810 (i.e, between the source-side doped regions 81S and the drain-side doped regions 81D) that underlie the source structure 88S and the drain structure 88D of each thin film transistor.

Figure 8:
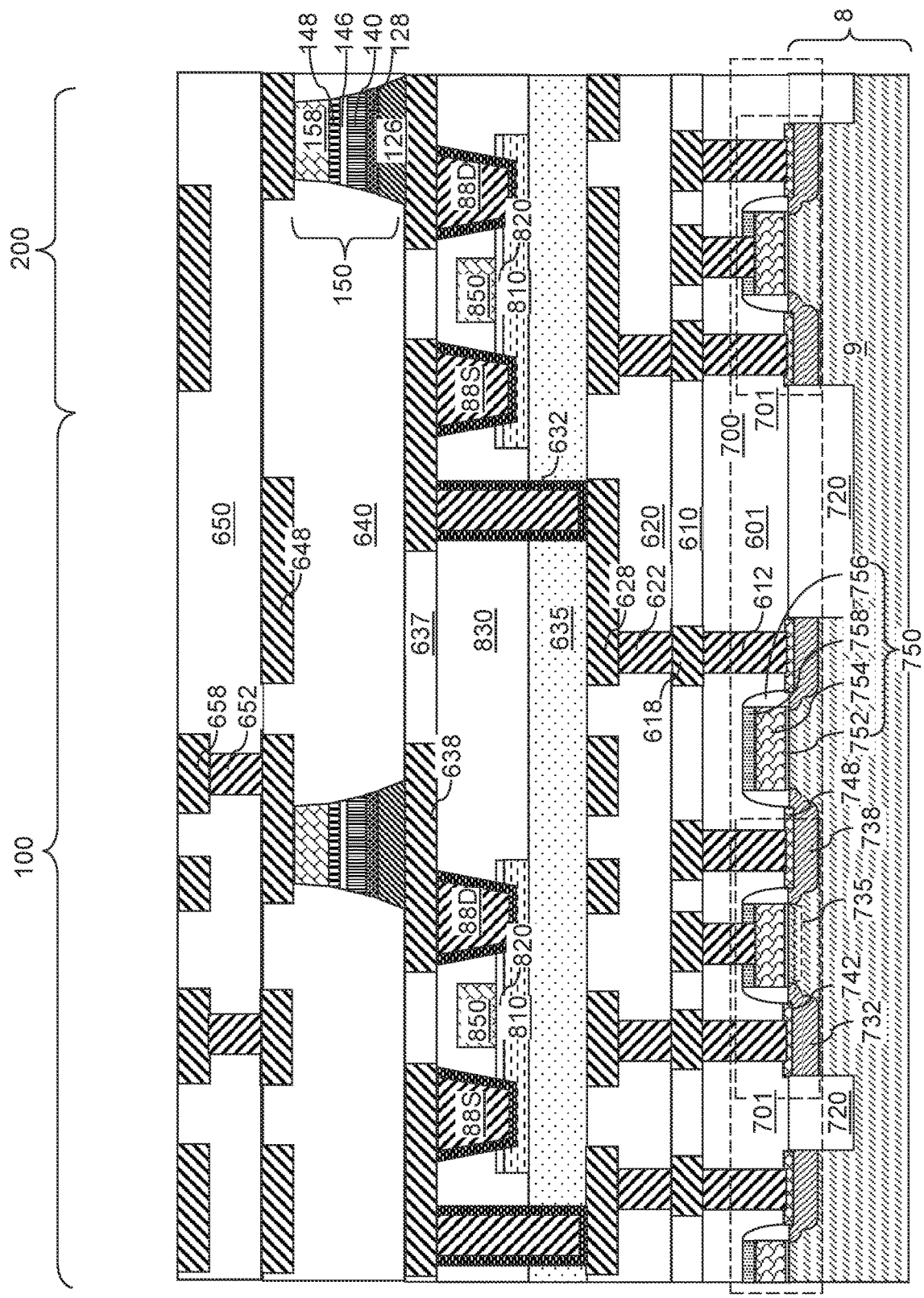
FIG. 8 is a vertical cross-sectional view of the exemplary structure after formation of thin film transistors and memory cells according to an embodiment of the present disclosure.

Referring to FIG. 8, the exemplary structure is illustrated after formation of thin film transistors. Second metal via structures 632 may be formed through the dielectric matrix layer 830 and the planar insulating spacer layer 635 on a respective one of the second metal line structures 628 concurrent with, before, or after, formation of the source structures 88S and the drain structures 88D.

A dielectric material layer, which is herein referred to as a third line-level dielectric material layer 637, may be deposited over the dielectric matrix layer 830. Third metal line structures 638 can be formed in the third line-level dielectric material layer 637 on a respective one of the metallic structures (88S, 88D, 632) formed within the dielectric matrix layer 830.

Additional metal interconnect structures formed within additional dielectric material layers may be subsequently formed over the thin film transistors and the third line-level dielectric material layer 637. In an illustrative example, the dielectric material layers may include, for example, a fourth interconnect-level dielectric material layer 640, a fifth interconnect-level dielectric material layer 650, etc. The additional metal interconnect structures may include third metal via structures (not illustrated) and fourth metal lines 648 formed within the fourth interconnect-level dielectric material layer 640, fourth metal via structures 652 and fifth metal line structures 658 formed within the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158.

Referring collective to FIGS. 1-8 and according to various embodiments of the present disclosure, a semiconductor structure is provided, which comprises: a planar insulating spacer layer 635 located over a substrate 8; a semiconducting material layer 810, a thin film transistor (TFT) gate dielectric layer 820, and a gate electrode 850 located over the planar insulating spacer layer 635; a dielectric matrix layer 830 located over the semiconducting material layer 810, the TFT gate dielectric layer 820, and the gate electrode 850; and a source structure 88S and a drain structure 88D vertically extending through the dielectric matrix layer 830 and contacting end portions of the semiconducting material layer 810, wherein each of the source structure 88S and the drain structure 88D comprises a metallic liner (86S, 186S, 86D, 186D) that generates tensile stress or compressive stress within end portions of the semiconducting material layer 810 that underlie the source structure 88S or the drain structure 88D.

In one embodiment, the metallic liner (86S, 186S, 86D, 186D) induces compressive stress within the end portions of the semiconducting material layer 810 and induces tensile stress between the end portions of the semiconducting material layer 810. In one embodiment, the metallic liner (86S, 186S, 86D, 186D) induces tensile stress within the end portions of the semiconducting material layer 810 and induces compressive stress between the end portions of the semiconducting material layer 810.

In one embodiment, each of the source structure 88S and the drain structure 88D comprises a respective metallic fill material portion (87S or 87D) that is laterally surrounded by a respective one of the metallic liners (86S, 186S, 86D, 186D).

In one embodiment, the semiconducting material layer 810 contacts a top surface of the planar insulating spacer layer 635; the TFT gate dielectric layer 820 contacts a top surface of the semiconductor material layer 810; and the gate electrode 850 contacts a top surface of the TFT gate dielectric layer 820.

In one embodiment, the gate electrode 850 contacts a top surface of the planar insulating spacer layer 635; the TFT gate dielectric layer 820 contacts a top surface of the gate electrode 850; and the semiconducting material layer 810 contacts a top surface of the TFT gate dielectric layer 820.

According to an aspect of the present disclosure, a semiconductor structure is provided, which comprises: a planar insulating spacer layer 635 located over a substrate 8; a semiconducting material layer 810 comprising a semiconducting material, a thin film transistor (TFT) gate dielectric layer 820, and a gate electrode 850 located over the planar insulating spacer layer 635; a dielectric matrix layer 830 located over the semiconducting material layer 810, the TFT gate dielectric layer 820, and the gate electrode 850; and a source structure 88S and a drain structure 88D vertically extending through the dielectric matrix layer 830 and contacting end portions of the semiconducting material layer 810, wherein the end portions of the semiconducting material layer 810 comprise dopant atoms and have a different lattice constant than a channel portion of the semiconducting material layer 810 located between the end portions of the semiconducting material layer 810.

In one embodiment, the dopant atoms comprise a metallic element, and a predominant fraction of the dopants atoms is located in substitutional sites. In one embodiment, each of the source structure 88S and the drain structure 88D extend below a horizontal plane including a top surface of the semiconducting material layer 810 and contacts a respective sidewall of the semiconducting material layer 810, which can be a sidewall of a source-side doped region 81S and/or a sidewall of a drain-side doped region 81D.

In one embodiment, the semiconductor structure comprises: metal interconnect structures (such as third metal line structures 638) contacting the source structure 88S and the drain structure 88D; and at least one memory cell 150 located on the metal interconnect structures.

Figure 9:
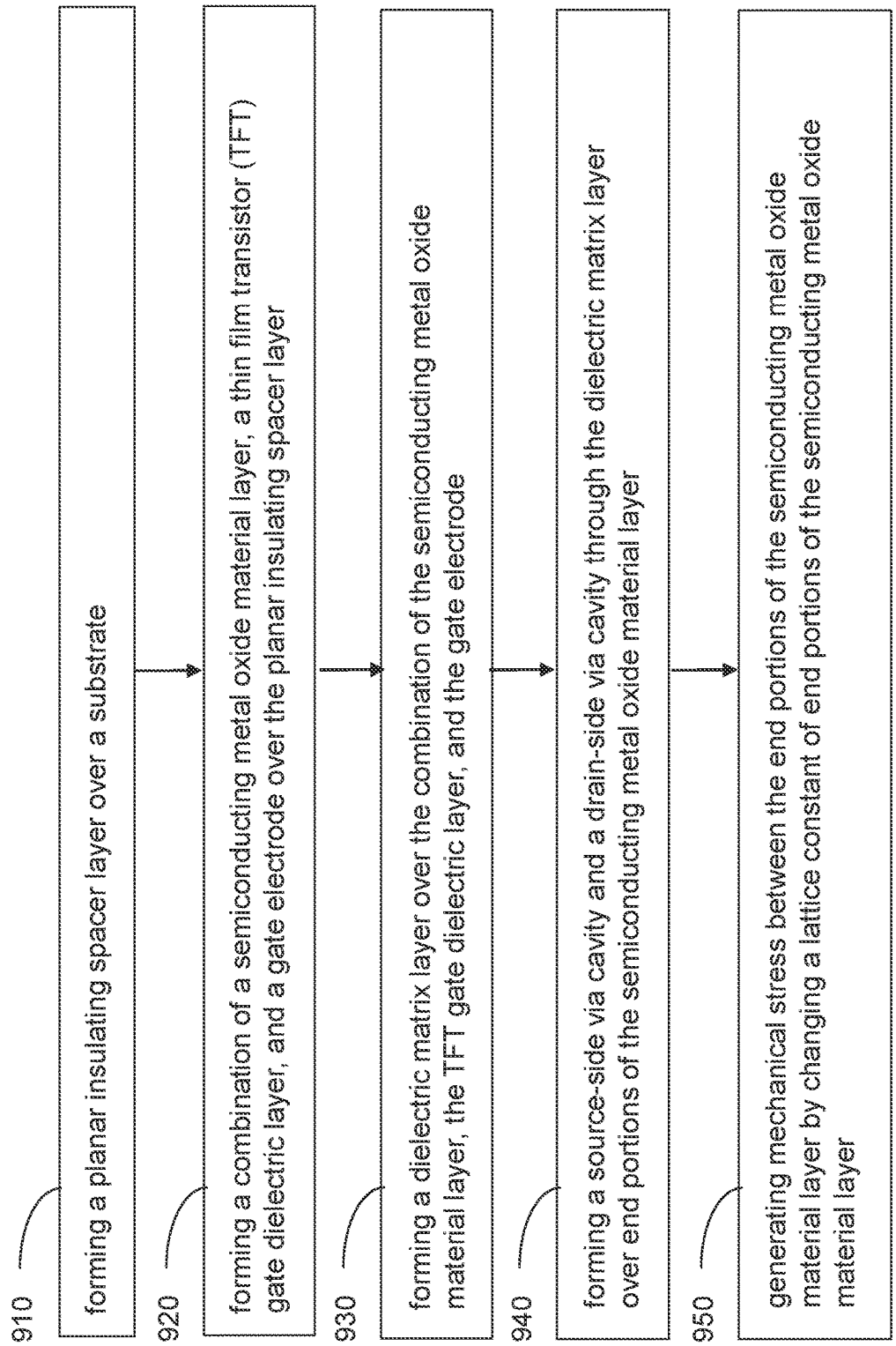
FIG. 9 is a flowchart that illustrates the general processing steps for manufacturing the semiconductor device of the present disclosure.

FIG. 9 is a flowchart that illustrates the general processing steps for manufacturing the semiconductor device of the present disclosure. Referring to step 910 and FIG. 1, a planar insulating spacer layer 635 can be formed over a substrate 8. Referring to step 920 and FIGS. 2A and 5A, a combination of a semiconducting material layer 810, a thin film transistor (TFT) gate dielectric layer 820, and a gate electrode 850 can be formed over the planar insulating spacer layer 635. Referring to step 930 and FIGS. 2A and 5A, a dielectric matrix layer 830 may be formed over the combination of the semiconducting material layer 810, the TFT gate dielectric layer 820, and the gate electrode 850. Referring to step 940 and FIGS. 2B and 5B, a source-side via cavity 84S and a drain-side via cavity 84D can be formed through the dielectric matrix layer 830 over end portions of the semiconducting material layer 810. Referring to step 950 and FIGS. 2C-2D, 3A-3B, 4A-4B, 5C-5D, 6A-6B, 7A-7B, and 8, mechanical stress can be generated between the end portions of the semiconducting material layer 810 by changing a lattice constant of end portions of the semiconducting material layer 810.

The various embodiments of the present disclosure can be used to generate compressive stress or tensile stress in channel portions of a semiconducting material layer 810. The compressive stress or tensile stress can be advantageously used to enhance the on-current of the thin film transistor. Mechanical stress can be generated between the end portions of the semiconducting material layer by changing a lattice constant of end portions of the semiconducting material layer. The mechanical stress can enhance the mobility of charge carriers in a channel portion of the semiconducting material layer. The type of stress that enhances the on-current of the thin film transistor can be determined based on the material composition and predominant crystallographic orientation in the semiconducting material layer 810. The mechanical stress may be generated by metallic liners (86S, 186S, 86D, 186D) in a source structure 88S and a drain structure 88D, or may be generated by a change in the lattice constant in end portions of the semiconducting material layer 810 (such as a source-side doped region 81S and a drain-side doped region 81D).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming a planar insulating spacer layer over a substrate;
   forming a combination of a semiconducting material layer, a thin film transistor (TFT) gate dielectric layer, and a gate electrode over the planar insulating spacer layer, wherein the gate electrode is formed within a recess in the planar insulating spacer, and the TFT gate dielectric layer and the gate electrode are formed by depositing and patterning a gate dielectric material and a semiconducting material over the gate electrode such that an entirety of a top surface of the TFT gate dielectric layer is in direct contact with a bottom surface of the semiconducting material layer;
   forming a dielectric matrix layer of which an entirety of a top surface is planar over the combination of the semiconducting material layer, the TFT gate dielectric layer, and the gate electrode, wherein all surfaces of the semiconducting material layer other than the bottom surface of the semiconducting material layer are in direct contact with the dielectric matrix layer;
   forming a source-side via cavity and a drain-side via cavity through the dielectric matrix layer over end portions of the semiconducting material layer; and
   generating mechanical stress between the end portions of the semiconducting material layer by changing a lattice constant of the end portions of the semiconducting material layer.

2. The method of claim 1, wherein changing the lattice constant of the end portions of the semiconducting material layer comprises depositing a metallic liner layer that generates tensile stress or compressive stress directly on physically exposed surfaces of the end portions of the semiconducting material layer.

3. The method of claim 2, wherein the metallic liner layer is deposited by atomic layer deposition and induces compressive stress within the end portions of the semiconducting material layer and induces tensile stress between the end portions of the semiconducting material layer.

4. The method of claim 2, wherein the metallic liner layer is deposited by physical vapor deposition and induces tensile stress within the end portions of the semiconducting material layer and induces compressive stress between the end portions of the semiconducting material layer.

5. The method of claim 2, further comprising:
forming a metallic fill material in remaining volumes of the source-side via cavity and the drain-side via cavity after depositing the metallic liner layer; and
removing portions of the metallic fill material and the metallic liner layer from above the dielectric matrix layer, wherein each contiguous combination of a remaining portion of the metallic liner layer and a remaining portion of the metallic fill material comprises a source structure or a drain structure.

6. The method of claim 1, wherein changing the lattice constant of the end portions of the semiconducting material layer comprises implanting dopant ions into the end portions of the semiconducting material layer.

7. The method of claim 1, wherein:
a recess is formed in the planar insulating spacer layer;
the gate electrode is formed in the recess;
the TFT gate dielectric layer is formed on a top surface of the gate electrode; and
the semiconducting material layer is formed over the TFT gate dielectric layer.

8. The method of claim 2, further comprising:
forming a source structure and a drain structure in the source-side via cavity and the drain-side via cavity, wherein each of the source structure and the drain structure comprises a portion of the metallic liner layer;
forming metal interconnect structures over the source structure and the drain structure; and
forming a memory cell over the metal interconnect structures.

9. The method of claim 8, further comprising:
forming semiconductor devices on the substrate; and
forming interconnect-level dielectric layers having formed therein metal interconnect structures over the semiconductor devices, wherein the planar insulating spacer layer is formed over the interconnect-level dielectric layers.

10. The method of claim 9, wherein the source structure is electrically connected to one of the semiconductor devices through a subset of the metal interconnect structures.

11. The method of claim 10, wherein the memory cell is electrically connected to the drain structure.

12. The method of claim 11, wherein a thin film transistor including the semiconducting material layer, the gate electrode, the source structure, and the drain structure is an access transistor for the memory cell.

13. A method of forming a semiconductor structure, comprising:
forming a planar insulating spacer layer over a substrate;
forming a combination of a semiconducting material layer, a thin film transistor (TFT) gate dielectric layer, and a gate electrode over the planar insulating spacer layer, wherein the gate electrode is formed within a recess in the planar insulating spacer, and the TFT gate dielectric layer and the gate electrode are formed by depositing and patterning a gate dielectric material and a semiconducting material over the gate electrode such that an entirety of a top surface of the TFT gate dielectric layer is in direct contact with a bottom surface of the semiconducting material layer;
forming a dielectric matrix layer of which an entirety of a top surface is planar over the combination of the semiconducting material layer, the TFT gate dielectric layer, and the gate electrode, wherein all surfaces of the semiconducting material layer other than the bottom surface of the semiconducting material layer are in direct contact with the dielectric matrix layer;
forming a source-side via cavity and a drain-side via cavity through the dielectric matrix layer over end portions of the semiconducting material layer;
forming a source structure and a drain structure in the source-side cavity and in the drain-side cavity, respectively, wherein each of the source structure and the drain structure comprises a metallic liner layer that generates tensile stress or compressive stress directly on physically exposed surfaces of the end portions of the semiconducting material layer by changing a lattice constant of the end portions of the semiconducting material layer.

14. The method of claim 13, further comprising:
forming a metallic fill material in remaining volumes of the source-side via cavity and the drain-side via cavity after depositing the metallic liner layer; and
removing portions of the metallic fill material and the metallic liner layer from above the dielectric matrix layer, wherein a first contiguous combination of a first remaining portion of the metallic liner layer and a first remaining portion of the metallic fill material comprises the source structure, and a second contiguous combination of a second remaining portion of the metallic liner layer and a second remaining portion of the metallic fill material comprises the drain structure.

15. The method of claim 13, further comprising forming a recess in the planar insulating spacer layer, wherein:
the gate electrode is formed in the recess on a top surface of the planar insulating spacer layer; and
the TFT gate dielectric layer is formed on a top surface of the gate electrode.

16. The method of claim 15, wherein the semiconducting material layer is formed over the TFT gate dielectric layer.

17. A method of forming a semiconductor structure, comprising:
forming semiconductor devices on a substrate;
forming interconnect-level dielectric layers embedding metal interconnect structures over the semiconductor devices;
forming a planar insulating spacer layer over the interconnect-level dielectric layers;
forming a combination of a semiconducting material layer, a thin film transistor (TFT) gate dielectric layer, and a gate electrode over the planar insulating spacer layer, wherein the gate electrode is formed within a recess in the planar insulating spacer, and the TFT gate dielectric layer and the gate electrode are formed by depositing and patterning a gate dielectric material and a semiconducting material over the gate electrode such that an entirety of a top surface of the TFT gate dielectric layer is in direct contact with a bottom surface of the semiconducting material layer;

forming a dielectric matrix layer of which an entirety of a top surface is planar over the combination of the semiconducting material layer, the TFT gate dielectric layer, and the gate electrode, wherein all surfaces of the semiconducting material layer other than the bottom surface of the semiconducting material layer are in direct contact with the dielectric matrix layer;

forming a source structure and a drain structure through the dielectric matrix layer, wherein each of the source structure and the drain structure protrudes downward from a horizontal plane including a top surface of the semiconducting material layer into a respective upper portion of the semiconducting material layer and generates tensile stress or compressive stress in end portions of the semiconducting material layer.

18. The method of claim 17, wherein the source structure and the drain structure are formed by:

forming a source-side via cavity and a drain-side via cavity through the dielectric matrix layer and into upper regions of the end portions of the semiconducting material layer;

depositing a metallic liner layer and a metallic fill material within the source-side via cavity and the drain-side via cavity; and removing portions of the metallic fill material and the metallic liner layer from above a horizontal plane including a top surface of the dielectric matrix layer, wherein portions of the metallic liner layer and the metallic fill material that fill the source-side via cavity comprise the source structure, and portions of the metallic liner layer and the metallic fill material that fill the drain-side via cavity comprise the drain structure.

19. The method of claim 18, wherein:

the metallic liner layer comprises a first material selected from Co, Ru, Mo, Ti, Ta, TiN, TaN, WN, alloys thereof, and compounds thereof; and the metallic fill material comprises a second material selected from Cu, Al, Co, Ru, Mo, Mn, Ti, Ta, W, TiN, TaN, an alloy thereof; and the second material is different from the first material.

20. The method of claim 1, wherein an entirety of a top surface of the planar insulating spacer is in direct contact with the TFT gate dielectric layer or with the dielectric matrix layer upon formation of the dielectric matrix layer.

* * * * *